US012032355B2

(12) United States Patent
Shinagawa et al.

(10) Patent No.: US 12,032,355 B2
(45) Date of Patent: Jul. 9, 2024

(54) VIRTUAL METROLOGY MODEL BASED SEASONING OPTIMIZATION

(71) Applicant: Tokyo Electron Limited, Tokyo (JP)

(72) Inventors: Jun Shinagawa, Fremont, CA (US);
Brian Pfeifer, Hopewell Junction, NY (US); John Solis, Austin, TX (US);
Brian Gessler, Hillsboro, OR (US);
Koichiro Nakamura, Miyagi (JP);
Yutaka Hirooka, Hillsboro, OR (US)

(73) Assignee: Tokyo Electron Limited, Tokyo (JP)

( * ) Notice: Subject to any disclaimer, the term of this patent is extended or adjusted under 35 U.S.C. 154(b) by 296 days.

(21) Appl. No.: 17/710,362

(22) Filed: Mar. 31, 2022

(65) Prior Publication Data
US 2023/0315047 A1 Oct. 5, 2023

(51) Int. Cl.
*G05B 19/4099* (2006.01)
*H01J 37/32* (2006.01)

(52) U.S. Cl.
CPC .... *G05B 19/4099* (2013.01); *H01J 37/32963* (2013.01); *G05B 2219/45031* (2013.01); *H01J 37/32935* (2013.01)

(58) Field of Classification Search
CPC ....... G05B 19/4099; G05B 2219/45031; H01J 37/32963; H01J 37/32935
USPC .......................................................... 700/121
See application file for complete search history.

(56) References Cited

U.S. PATENT DOCUMENTS

| 5,016,663 | A | 5/1991 | Mase et al. |
| 9,136,138 | B2 * | 9/2015 | Baek ................. H01J 37/32853 |
| 10,895,539 | B2 | 1/2021 | Sawlani et al. |
| 10,896,833 | B2 | 1/2021 | Kommisetti et al. |
| 2007/0051470 | A1 * | 3/2007 | Iwakoshi ............ B08B 7/0035 700/121 |
| 2010/0178415 | A1 * | 7/2010 | Nishimori ......... H01J 37/32963 427/8 |
| 2018/0082826 | A1 * | 3/2018 | Guha ................ H01J 37/32082 |
| 2021/0050191 | A1 * | 2/2021 | Usami ............... H01J 37/32926 |
| 2022/0214662 | A1 * | 7/2022 | Panda .................... G06N 20/00 |

(Continued)

FOREIGN PATENT DOCUMENTS

| CN | 101006550 A | * | 7/2007 | ........ H01J 37/32174 |
| CN | 100355040 C | * | 12/2007 | ....... H01L 21/67253 |

(Continued)

*Primary Examiner* — Ronald D Hartman, Jr.
(74) *Attorney, Agent, or Firm* — Oblon, McClelland, Maier & Neustadt, L.L.P.

(57) ABSTRACT

A method for detecting an endpoint of a seasoning process for a plasma tool includes (a) operating the plasma tool to run a seasoning recipe on at least one seasoning wafer before running a monitoring recipe on at least one monitoring wafer; (b) collecting, while running the monitoring recipe on the monitoring wafer, monitoring data associated with the running the monitoring recipe; and (c) generating an estimated product parameter using a virtual metrology (VM) model that is configured to estimate a product parameter using the monitoring data. The VM model is based on production data associated with running a production recipe on production wafers and product parameters of the production wafers measured after the running the production recipe. The endpoint of the seasoning process is obtained by repeating (a), (b) and (c), and the endpoint is obtained when the estimated product parameter stabilizes.

20 Claims, 5 Drawing Sheets

(56) References Cited

U.S. PATENT DOCUMENTS

2023/0009419 A1\* 1/2023 Shinagawa ....... H01J 37/32935
2023/0185255 A1\* 6/2023 Hong ................ H01L 21/67253
                                                              700/121

FOREIGN PATENT DOCUMENTS

| JP | 2004235312 A | \* | 8/2004 | ........ H01J 37/32935 |
| JP | 2013-187226 A | | 9/2013 | |
| WO | WO-03077303 A1 | \* | 9/2003 | ....... H01L 21/67253 |
| WO | WO-03103024 A2 | \* | 12/2003 | ......... G05B 19/4065 |
| WO | WO-2022150390 A1 | \* | 7/2022 | ......... G05B 13/0265 |

\* cited by examiner

VIRTUAL METROLOGY MODEL BASED SEASONING OPTIMIZATION

FIELD OF THE INVENTION

This disclosure relates generally to semiconductor fabrication and, more particularly, to optimizing processes of a plasma tool.

BACKGROUND

Device formation within microelectronic workpieces typically involves a series of manufacturing techniques related to the formation, patterning and removal of a number of layers of materials on a substrate. To meet the physical and electrical specifications of current and next generation semiconductor devices, process flows are being developed to reduce feature size while maintaining structure integrity for various patterning processes. Particularly, plasma processing plays a vital role in the deposition and removal of materials in the production of semiconductor devices. Typical examples include plasma-assisted chemical vapor deposition, plasma-assisted physical vapor deposition, plasma etching, plasma cleaning, etc.

SUMMARY

The present disclosure relates to a method for detecting an endpoint of a seasoning process for a plasma tool.

Aspect (1) includes a method for detecting an endpoint of a seasoning process for a plasma tool. The method includes (a) operating the plasma tool to run a seasoning recipe on at least one seasoning wafer before running a monitoring recipe on at least one monitoring wafer, (b) collecting, while running the monitoring recipe on the monitoring wafer, monitoring data associated with the running the monitoring recipe, and (c) generating an estimated product parameter using a virtual metrology (VM) model that is configured to estimate a product parameter using the monitoring data. The VM model is based on production data associated with running a production recipe on production wafers and product parameters of the production wafers measured after the running the production recipe. The endpoint of the seasoning process is obtained by repeating (a), (b) and (c), and the endpoint is obtained when the estimated product parameter stabilizes.

Aspect (2) includes the method of Aspect (1), wherein the seasoning wafer and the monitoring wafer are blanket wafers including a same film composition.

Aspect (3) includes the method of Aspect (2), wherein the seasoning recipe and the monitoring recipe include a same recipe.

Aspect (4) includes the method of Aspect (3), where (b) further includes collecting, while running the seasoning recipe on the seasoning wafer, seasoning data associated with the running the seasoning recipe. The seasoning data are added to the monitoring data.

Aspect (5) includes the method of Aspect (3), wherein the same film composition and the same recipe are configured such that running the seasoning recipe on the seasoning wafer and running the monitoring recipe on the monitoring wafer both generate at least one same byproduct as running the production recipe on the production wafers.

Aspect (6) includes the method of Aspect (1), wherein the seasoning wafer is a blanket wafer including a first film composition. The monitoring wafer includes a second film composition that is different from the first film composition.

Aspect (7) includes the method of Aspect (6), wherein the monitoring recipe is different from the seasoning recipe.

Aspect (8) includes the method of Aspect (6), wherein the second film composition and the monitoring recipe are configured such that running the monitoring recipe on the monitoring wafer generates at least one same byproduct as running the production recipe on the production wafers.

Aspect (9) includes the method of Aspect (6), wherein the monitoring wafer is a blanket wafer.

Aspect (10) includes the method of Aspect (1), wherein the seasoning wafer is a blanket wafer. The production wafers are patterned wafers.

Aspect (11) includes the method of Aspect (1), further including performing a preventative maintenance on the plasma tool, prior to the seasoning process.

Aspect (12) includes the method of Aspect (11), wherein the preventative maintenance includes at least one of replacing consumable parts, pulling and re-sealing vacuum connections or performing clean operations.

Aspect (13) includes the method of Aspect (11), further including building the VM model prior to the preventative maintenance or building the VM model using historical data collected prior to the preventative maintenance.

Aspect (14) includes the method of Aspect (11), further including, prior to the preventative maintenance, running the production recipe on the production wafers. The production data associated with the running the production recipe are collected while running the production recipe on the production wafers. The product parameters of the production wafers are measured after running the production recipe on the production wafers Aspect (15) includes the method of Aspect (1), wherein (b) is accomplished by using one or more sensors associated with the plasma tool.

Aspect (16) includes the method of Aspect (15), wherein the one or more sensors are located outside a processing chamber for the plasma tool, inside the processing chamber, or both outside and inside the processing chamber.

Aspect (17) includes the method of Aspect (15), the one or more sensors include at least one of an optical emission spectrometry (OES) sensor, a reflectometer, a plasma sensor, a voltage and current (VI) sensor, a radio frequency (RF) sensor, a RF power meter, a pressure manometer or a gas flow meter.

Aspect (18) includes the method of Aspect (1), wherein the monitoring data include at least one of OES data, reflectometry data, gas concentrations, VI data, RF data, pressure data, gas flow rate data or temperature data.

Aspect (19) includes the method of Aspect (1), wherein the product parameter includes at least one of a critical dimension (CD), an etch rate (ER), etch selectivity, an amount of remaining mask material, a film thickness, a film chemical composition, a film deposition rate, a film reflectivity, film absorbance, film resistivity or film conductivity.

Aspect (20) includes an apparatus. The apparatus includes a controller including a processor that is programmed to detect an endpoint of a seasoning process for a plasma tool by (a) operating the plasma tool to run a seasoning recipe on at least one seasoning wafer before running a monitoring recipe on at least one monitoring wafer. The processor is programmed to (b) collect, while running the monitoring recipe on the monitoring wafer, monitoring data associated with the running the monitoring recipe. The processor is programmed to (c) generate an estimated product parameter using a virtual metrology (VM) model that is configured to estimate a product parameter using the monitoring data. The VM model is based on production data associated with running a production recipe on production wafers and product parameters of the production wafers measured after the running the production recipe. The processor is programmed to obtain the endpoint of the seasoning process by repeating (a), (b) and (c). The endpoint is obtained when the estimated product parameter stabilizes.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
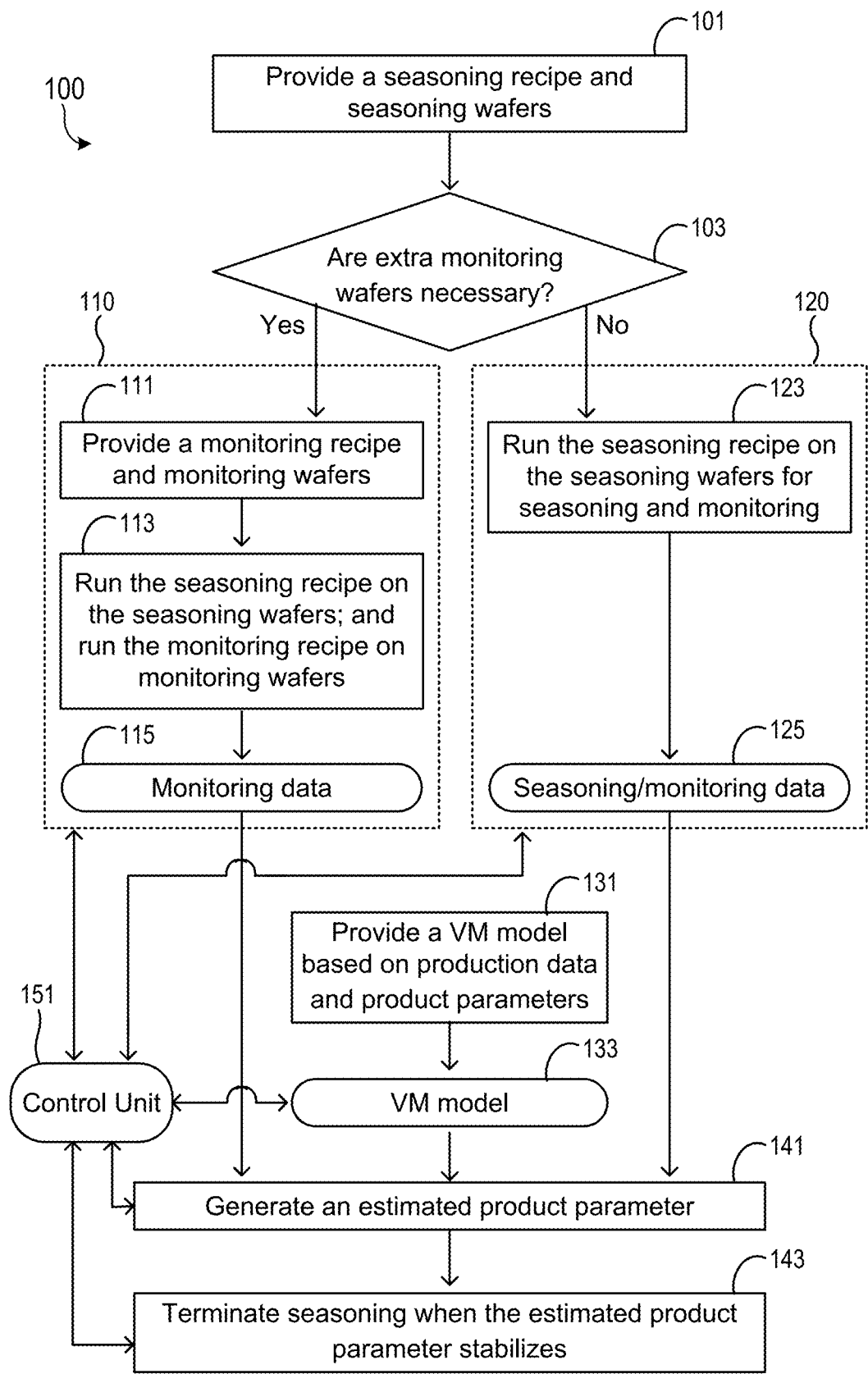
FIG. 1 shows a diagram of a seasoning process for a plasma tool, in accordance with some example embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As noted in the Background, plasma processing tools are widely used in the manufacture of microelectronic workpieces. Plasma processing tools require periodic preventative maintenance (PM) to maintain performance. After PM work is completed, plasma processing tools typically require tuning to match post-process structural profiles such as critical dimension (CD) profiles against pre-PM operations and/or other operating plasma processing tools. This tuning processing is commonly referred to as a seasoning process, a conditioning process or a post-PM tool matching process. The seasoning process can be costly and time-consuming because tool seasoning process and hardware control knobs are often tuned iteratively based on actual metrology measurements made to patterned structures on test wafers after runs through the plasma processing tool.

To minimize device performance variabilities, variabilities in the post-process structural profiles among plasma processing tools, such as CD profiles, are tightly controlled during production runs. However, such tight control is typically lost after PM as the tool conditions are significantly altered by PM work such as breaking vacuum and replacing consumable parts. These altered chamber conditions result in loss of the profile control. As a result, chamber seasoning or conditioning is often required after maintenance work in order to stabilize chamber for process repeatability. Nevertheless, significant time and resources are often spent on re-establishing the profile control after PM work, which is commonly referred to as post-PM recovery. For example, CD profiles can be tuned during the post-PM recovery to target values by re-adjusting recipe parameters, and this is typically achieved by running patterned wafers iteratively through the processing chamber. These runs using patterned wafers, however, are costly and time-consuming.

Blanket wafers, on the other hand, are less expensive than patterned wafers and can provide a cost-effective way of performing process analysis. Blanket wafers are test wafers that include one or more films or material layers, such as a layer of silicon oxide and/or a layer of polysilicon. In a chamber seasoning process, a seasoning recipe can be run with test wafers, such as blanket wafers, with a specific film type or a specific film composition in order to eliminate sources of chamber instability such as residual water or chamber wall materials, which can impact plasma chemistry composition. Chamber seasoning may coat or clean chamber surface; chamber seasoning may also etch chamber parts.

While using blanket wafers rather than patterned wafers can substantially reduce cost, there are other challenges in developing and optimizing the chamber seasoning process, particularly in detecting an endpoint of the chamber seasoning process. In related examples, the seasoning process trend is often associated with by-product signals, voltage signals, temperature, camera output, multi-sensors (i.e. multiple sensors) and/or the like. In other words, the endpoint is determined indirectly. Such indirect approaches may fail to accurately predict the seasoning endpoint, for example when an endpoint detection (EPD) signal is not sensitive to chamber variations which may impact process results. Hence, the indirectly-determined endpoint needs to be calibrated or confirmed, often by using a patterned wafer. Moreover, when more than one root cause is impacting process results, not only can the endpoint be inaccurately predicted, it can also be difficult to determine the more than one root cause of process instability.

Such indirect approaches to endpoint detection of a process in a plasma tool are commonly seen in related technologies. For example, in a US patent application publication (US20100178415A1), a chamber is cleaned using F-based chemistry such as $SF_6$. In this cleaning process, $SiF_4$ can be generated as a byproduct during the removal of Si-based materials deposited (or accumulated) on the chamber surface. Accordingly, $SiF_4/Ar$ (i.e. a ratio of $SiF_4$ signals to Ar signals) is monitored, e.g. in optical emission spectrometry (OES). Nevertheless, such monitoring requires patterned wafers and metrology measurements to determine the endpoint of $SiF_4/Ar$ signals. In another US patent application publication (U.S. Pat. No. 10,896,833B2), a multi-variate analysis model is built with indirect seasoning data and regressed against "historical seasoning reference data". In yet another US patent application publication (U.S. Pat. No. 10,895,539B2), a camera or a "computer vision system" is used to monitor materials deposited on chamber for EPD. OES is not available here as cleaning is done with remote plasma source. In yet another US patent application publication (U.S. Pat. No. 502,663), temperature or impedance is used for EPD. Other US patent application publications (e.g. US20100178415A1 and JP2013187226A) also teach indirect approaches to EPD.

The present disclosure provides a direct approach to endpoint detection or determination. Techniques herein include utilizing a virtual metrology (VM) model to directly estimate stability of a product parameter, such as a critical dimension (CD). The VM model can be provided by a third party or built by oneself, based on measured product parameters (e.g. CD data) collected on production wafers after production runs as well as production data associated with the production runs. Therefore, the VM model can be used to directly estimate or predict the product parameter.

Techniques herein can include inserting monitoring runs between seasoning runs during a seasoning process. Monitoring data associated with the monitoring runs are collected and can be used as an input for the VM model to generate an estimated product parameter, such as an estimated CD. The endpoint can be obtained when the estimated product parameter stabilizes. Techniques herein can thus provide better estimate of CD stability than related examples where CD stability is indirectly estimated using for example by-product OES signal during seasoning.

According to some aspects of the present disclosure, the monitoring runs and the seasoning runs can use different recipes and different types of wafers (e.g. blanket wafers having different film compositions). Alternatively, the monitoring runs and the seasoning runs can use a same recipe and a same type of wafers (e.g. blanket wafers having a same film composition). As a result, the monitoring runs and the seasoning runs can both be used for dual purposes, i.e. monitoring and seasoning. Seasoning data associated with the seasoning runs can therefore be added to the monitoring data and used as an input for the VM model to generate an estimated product parameter. In other words, the monitoring runs and the seasoning runs can both be referred to as seasoning/monitoring runs. Accordingly, the seasoning data and the monitoring data can both be used for the dual purposes and thus referred to as seasoning/monitoring data.

FIG. 1 shows a diagram of a seasoning process 100 for a plasma tool, in accordance with some example embodiments of the present disclosure. While not shown, a preventative maintenance (PM) can be performed on the plasma tool prior to seasoning. The PM can, for example, include pulling and re-sealing vacuum connections, performing clean operations such as a wet or dry clean operation, replacing consumable parts, and/or other maintenance actions. After the PM is completed, seasoning is performed. Common seasoning targets include, for example, cleaning deposited film or material off the inner chamber surface, depositing or modifying a chemical composition of the inner chamber surface, modifying mechanical properties (for example by tuning surface roughness and/or etching parts materials), etc. Seasoning targets and seasoning operation may depend on the intended use for the plasma tool, e.g. film deposition, etching, cleaning, etc. For example, a seasoning recipe may be configured to be similar to a production recipe in order for seasoning runs to simulate production runs.

As illustrated in FIG. 1, at least one virtual metrology (VM) model 133 can be utilized to directly estimate stability of a product parameter, such as a critical dimension (CD). Note that the VM model 133 can be provided by a third party or built (or provided) by oneself in Block 131. In one embodiment, the VM model 133 is built prior to the PM. Specifically, a production recipe (e.g. for film deposition, etching, cleaning, etc.) can be run on production wafers (e.g. patterned wafers). In the meantime, production data associated with the running the production recipe can be collected. After production runs (i.e. running the production recipe on the production wafers), the product parameters of the production wafers are measured. The VM model 133 can then be built based on the production data and the (measured) product parameters, for instance by using a method disclosed in the Applicant's pending US patent application (application Ser. No. 17/025,651). In another embodiment, the VM model 133 is built using historical data collected prior to the PM, such as historical production data and historically-measured product parameters. Thus, the VM model 133 can be built before, during or after the PM.

Since the VM model 133 is based on the production data and the product parameters, the VM model 133 can be used to generate an estimated product parameter, for instance by using data collected during the seasoning process 100, which may need to be taken into consideration in designing and executing steps of the seasoning process 100, for example steps shown in Block 101 and Block 103 in FIG. 1.

In Block 101, a seasoning recipe and seasoning wafers (e.g. blanket wafers) can be provided for the seasoning process 100. In Block 103, the question "are extra monitoring wafers necessary?" is addressed. In other words, can the seasoning recipe and the seasoning wafers be used for monitoring? In some embodiments, whether extra monitoring wafers are necessary is related to the VM model 133. In one embodiment, seasoning data associated with seasoning runs (i.e. running the seasoning recipe on the seasoning wafers) can be used as an input for the VM model 133 and generate an estimated product parameter with acceptable accuracy or acceptable error (for example less than 20% error, preferably less than 10% error, preferably less than 5% error). Thus, extra monitoring wafers are not necessary. The seasoning process 100 then proceeds to Box 120. In another embodiment, the seasoning data cannot be used as an input for the VM model 133 or may generate an estimated product parameter with unacceptable accuracy or unacceptable error. Thus, extra monitoring wafers are necessary, and a monitoring recipe may be needed for the monitoring wafers to execute monitoring runs. The seasoning process 100 then proceeds to Box 110.

In some embodiments, the VM model 133 can estimate a product parameter using data that are similar to the production data. For instance, the production data can include optical emission spectrometry (OES) data of a byproduct of the production runs while the (measured) product parameters include CD. Ergo, the VM model 133 can be configured to estimate CD using similar OES data of the byproduct of runs other than the production runs, such as the monitoring runs.

In a non-limiting example, the production wafers are patterned wafers that include a patterned film of silicon nitride over polysilicon. The patterned film of silicon nitride can be used as an etching mask for (selectively) etching polysilicon so an etch rate of polysilicon is (much) larger than that of silicon nitride. Hence, byproducts are dominated by species generated from polysilicon (e.g. $SiCl_4$, $SiF_4$, $SiBr_4$, etc.). In other words, at least half the byproducts are generated as a result of the polysilicon film reacting with etchant radicals (e.g. Cl·, F·, Br· . . . ). The byproduct associated with or used in the VM model 133 can for instance include $SiCl_4$. In one embodiment, the seasoning runs also generate $SiCl_4$ and allow the VM model 133 to generate an estimated product parameter with the acceptable accuracy or the acceptable error. Extra monitoring wafers are thus not needed. Accordingly, the seasoning runs as well as the seasoning data can both be used for dual purposes, i.e. seasoning and monitoring. Therefore, the seasoning runs can also be referred to as monitoring runs or seasoning/monitoring runs. The seasoning data can also be referred to as monitoring data or seasoning/monitoring data. In another embodiment, seasoning runs do not generate $SiCl_4$ so extra monitoring wafers are needed. In yet another embodiment, seasoning runs generate $SiCl_4$ but data of the $SiCl_4$ lead to an estimated product parameter with unacceptable accuracy or unacceptable error. Thus, extra monitoring wafers are still needed.

In some embodiments, the accuracy or error of the estimated product parameter is related to a signal intensity of the byproduct, which is further related to a chemical composition of the corresponding wafers (e.g. the monitoring wafers and the seasoning wafers). For instance, an open area ratio (OAR) of the production wafers can be 40%, meaning that an area of silicon nitride accounts for 60% of an overall exposed surface area (e.g. an area of silicon nitride plus an exposed area of underlying polysilicon). As previously mentioned, the byproduct $SiCl_4$ can be generated by polysilicon reacting with chlorine radicals. Silicon nitride, while also containing silicon atoms, does not generate as much $SiCl_4$ as polysilicon in a selective etching process, e.g. in the production runs, in the seasoning runs and/or in the monitoring runs. As a result, a seasoning wafer can include a silicon wafer or at least a polysilicon film. A piece of silicon nitride wafer can be physically pasted to the silicon wafer or the polysilicon film in order to emulate/simulate the OAR. For example, when a silicon nitride wafer covers about 59% of a surface area of a silicon wafer, signal intensity of $SiCl_4$ will be close to that of $SiCl_4$ for the production wafers with an OAR of 40% in the production runs, resulting in acceptable accuracy or error.

In Block 111 of Box 110, a monitoring recipe and monitoring wafers are provided. The monitoring recipe and the monitoring wafers are configured such that monitoring runs (i.e. running the monitoring recipe on the monitoring wafers) can generate the byproduct of the production runs and monitoring data associated with the monitoring runs can be used as an input for the VM model 133 and generate an estimated product parameter with acceptable accuracy or error. For example, the monitoring wafers can include a film composition which is similar or identical to a film composition of the production wafers. The monitoring recipe can be similar or identical to the production recipe. Particularly, the monitoring recipe can be provided by modifying or tailoring the production recipe for the monitoring wafers.

In Block 113, the seasoning recipe is run on the seasoning wafers, and the monitoring recipe is run on the monitoring wafers. Specifically, every time after the seasoning recipe is run on one or more seasoning wafers, the monitoring recipe can be run on one or more monitoring wafers. Monitoring data 115 can be collected during the corresponding one or more monitoring runs every time in order to constantly monitor chamber conditions and seasoning progress. Note that the monitoring runs can be inserted between the seasoning runs, as disclosed in the Applicant's pending US patent application (Publication No. US20210050191A1).

Figure 2A:
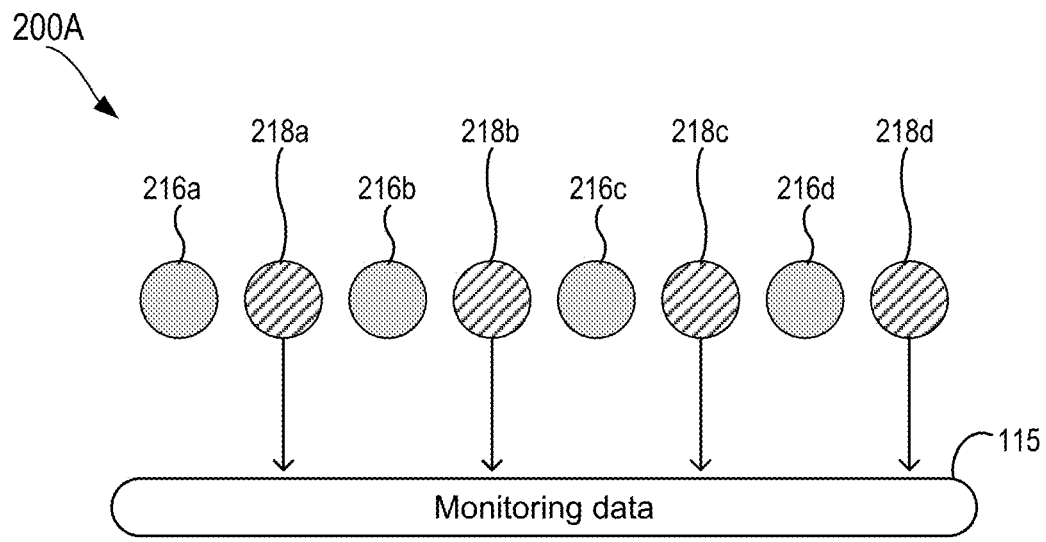
FIG. 2A shows a wafer processing sequence, in accordance with one embodiment of the present disclosure.

FIG. 2A shows a first wafer processing sequence 200A of the Block 113, in accordance with one embodiment of the present disclosure. In the first wafer processing sequence 200A, the seasoning runs (e.g. as shown by 216a, 216b, 216c and 216d) and the monitoring runs (e.g. as shown by 218a, 218b, 218c and 218d) are arranged in an alternating order. That is, the chamber conditions and the seasoning progress are monitored after every seasoning run. It should be understood that in other embodiments (not shown), there may be more than one seasoning run between two neighboring monitoring runs. There may be more than one monitoring run between two neighboring seasoning runs. For example, monitoring runs can be executed less frequently during an early stage of chamber seasoning and gradually executed more frequently as chamber seasoning progresses.

Referring back to FIG. 1, the seasoning recipe is run on the seasoning wafers for the dual purposes, i.e. seasoning and monitoring, in Block 123 of Box 120. The seasoning recipe and the seasoning wafers are configured such that seasoning runs (i.e. running the seasoning recipe on the seasoning wafers) can generate the byproduct of the production runs and seasoning data associated with the seasoning runs can be used as an input for the VM model 133 and generate an estimated product parameter with acceptable accuracy or error. For example, the seasoning wafers can include a film composition which is similar or identical to a film composition of the production wafers. The seasoning recipe can be similar or identical to the production recipe. Particularly, the seasoning recipe can be provided by modifying or tailoring the production recipe for the seasoning wafers. Further, because of the dual purposes, the seasoning runs can also be referred to as monitoring runs or seasoning/monitoring runs. The seasoning data can also be referred to as monitoring data or seasoning/monitoring data 125.

Figure 2B:
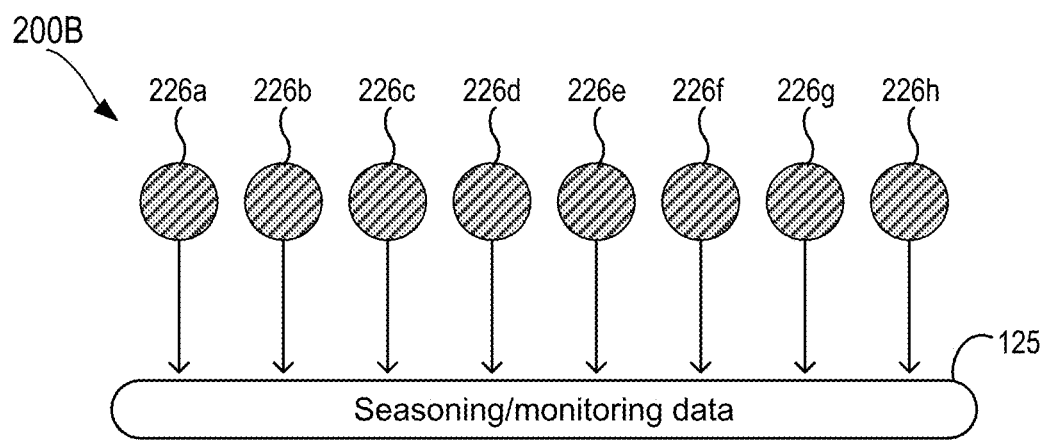
FIG. 2B shows another wafer processing sequence, in accordance with another embodiment of the present disclosure.

FIG. 2B shows a second wafer processing sequence 200B of the Block 123, in accordance with one embodiment of the present disclosure. In the second wafer processing sequence 200B, every seasoning run (e.g. as shown by 226a, 226b,

226c, 226d, 226e, 226f, 226g and 226h) can be used for both seasoning and monitoring. Therefore, the seasoning/monitoring data 125 can be collected during every run. It should be understood that in other embodiments (not shown), the seasoning/monitoring data 125 may not be collected (and/or stored) during every run. For example, the seasoning/monitoring data 125 may be collected less frequently during an early stage of chamber seasoning and gradually collected more frequently as chamber seasoning progresses.

After the monitoring data 115 or the seasoning/monitoring data 125 are collected, the seasoning process 100 then proceeds to Block 141. Herein, an estimated product parameter is generated using the VM model 133 and using the monitoring data 115 or the seasoning/monitoring data 125 as an input for the VM model 133.

While not shown, the estimated product parameter can be tracked over time to study a trend thereof, so as to detect or determine an endpoint of the seasoning process 100. Specifically, the endpoint can be obtained when the estimated product parameter stabilizes, which will be explained in detail later. Thus in Block 143, seasoning (the seasoning process 100) can be terminated when the estimated product parameter stabilizes.

Although repeated runs may still be required in Block 113 and Block 123, the repeated runs may each only require a blanket wafer, and the VM model 133 is used rather than direct metrology-based measurements. As such, expense and cycle time can be greatly reduced as compared to prior solutions. Rather than require many patterned wafers and/or related metrology-based measurements, techniques herein do not necessarily entail a patterned wafer. Of course a patterned wafer may optionally be used only as a check to confirm the completion of the seasoning process 100 in some embodiments.

Further, a control unit 151 (also referred to as a controller 151) may optionally be included in the example of FIG. 1. Components of a corresponding plasma tool can be connected to and controlled by the control unit 151 that may optionally be connected to a corresponding memory storage unit and user interface (all not shown). Various plasma-processing operations can be executed via the user interface, and various plasma processing recipes and operations can be stored in a storage unit. Accordingly, a given substrate can be processed within a plasma chamber with various microfabrication techniques.

It will be recognized that the control unit 151 may be coupled to various components of the corresponding plasma tool to receive inputs from and provide outputs to the components. For example, the control unit 151 can be configured to receive the monitoring data 115 and/or the seasoning/monitoring data 125 from a corresponding plasma tool. The control unit 151 can also be configured to adjust knobs and control settings for the corresponding plasma tool. Of course the adjustments can be manually made as well.

It will also be recognized that the control unit 151 may be coupled to various components of the seasoning process 100 to receive inputs from and provide outputs to the components. For example, the control unit 151 can be configured to receive the monitoring data 115 from Box 110 and/or the seasoning/monitoring data 125 from Box 120. The control unit 151 can further be configured to implement Box 110 and/or Box 120. For example, the control unit 151 can implement Block 113 and/or Block 123 by executing a corresponding recipe on at least one corresponding wafer. Additionally, the control unit 151 can be configured to input the monitoring data 115 and/or the seasoning/monitoring data 125 into the VM model 133, and/or receive the estimated product parameter from the VM model 133. The control unit 151 may also be configured to implement the VM model 133. The control unit 151 may further be configured to obtain the endpoint and terminate seasoning when the estimated product parameter stabilizes. Of course, one or more functions of the control unit 151 can also be manually accomplished.

The control unit 151 can be implemented in a wide variety of manners. In one example, the control unit 151 is a computer. In another example, the control unit 151 includes one or more programmable integrated circuits that are programmed to provide the functionality described herein. For example, one or more processors (e.g. microprocessor, microcontroller, central processing unit, etc.), programmable logic devices (e.g. complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g. memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Note that the plasma tool associated with the seasoning process 100 may be a capacitively-coupled plasma processing apparatus, inductively-coupled plasma processing apparatus, microwave plasma processing apparatus, Radial Line Slot Antenna (RLSA™) microwave plasma processing apparatus, electron cyclotron resonance (ECR) plasma processing apparatus, or other types of processing systems or combination of systems. Thus, it will be recognized by those skilled in the art that the techniques described herein may be utilized with any of a wide variety of plasma processing systems. The plasma tool can be used for a wide variety of operations including, but not limited to, etching, deposition, cleaning, plasma polymerization, plasma-enhanced chemical vapor deposition (PECVD), atomic layer deposition (ALD), atomic layer etch (ALE), and the like. The structure of a plasma tool is well known to one skilled in the art. It will be recognized that different and/or additional plasma process systems may be implemented while still taking advantage of the techniques described herein.

It is noted that the example embodiments described herein focus on CD as the product parameter. CD can include, but is not limited to, one or more feature dimensions such as width, length, sidewall angle, feature depth, and/or other feature dimensions. For example, with respect to a gate of a transistor device, CD can include top, middle and/or bottom widths of the gate as well as the gate-related width at a height level for other structures associated with the transistor device. Further, CD can include CD profiles which may include one-dimension (1D) features, two-dimensional (2D) features, three-dimensional (3D) features, or any combination thereof.

It is also understood that CD is used herein merely for illustrative purposes, and other product parameters can also be used in addition to and/or in lieu of CD. In some embodiments, an etch rate, etch selectivity, a film deposition rate or other parameters can be used. The etch rate, for example, can be a film removal rate in a selected direction, such as a vertical direction. The etch selectivity, for example, can be a ratio of etch rates for two types of films. The film deposition rate, for example, can be an increase in film thickness per unit time at a selected area of a wafer, such as a center of the wafer. Additionally, the product parameter may include a film thickness, a film chemical composition, a film reflectivity, a film absorbance, an amount of remaining mask material, film resistivity and/or film conductivity. Note that the product parameter can be measured outside the plasma tool using one or more metrology tools. The one or more metrology tools may include electrical, optical, and/or analytical tools, such as resistivity/conductivity measurement tools, film thickness measurement tools, optical microscopes, transmission/scanning electron microscopes, atomic force microscopes and/or other test and measurement tools. Alternatively, the product parameter can be measured inside the plasma tool by one or more sensors associated with the plasma tool, which will be explained in detail later.

It is further noted that the embodiments described in the present disclosure focus on the use of blanket wafers rather than patterned wafers as with prior solutions. Blanket wafers are test wafers that include one or more films or material layers, such as a layer of silicon oxide and/or a layer of polysilicon. Use of blanket wafers rather than pattern wafers can substantially reduce cost. The seasoning wafers provided in Block 101, for instance, can be blanket wafers. The monitoring wafers provided in Block 111, for instance, can be blanket wafers. Other test wafers, however, can also be used in addition to and/or in lieu of blanket wafers. Other variations can also be implemented while still taking advantage of the techniques described herein.

Further, data, such as the production data, the seasoning data, the monitoring data and the seasoning/monitoring data, can be collected or measured by using one or more sensors associated with the plasma tool. The one or more sensors can be located outside a processing chamber of the plasma tool, inside the processing chamber, or both outside and inside the processing chamber. Thus, the sensors can include in-situ sensors and/or module sensors. The module sensors, for example, can include a pressure manometer, a gas flow meter, a radio frequency (RF) power meter and the like. The in-situ sensors, for example, can include a reflectometer, an optical emission spectroscopy (OES) sensor, a plasma sensor, an RF sensor or a voltage and current (VI) sensor. Ergo, the data, such as the production data, the seasoning data, the monitoring data and the seasoning/monitoring data, can include, but are not limited to, OES data, reflectometry data, gas concentrations, VI data, RF data, pressure data, gas flow rate data and temperature data.

Figure 3A:
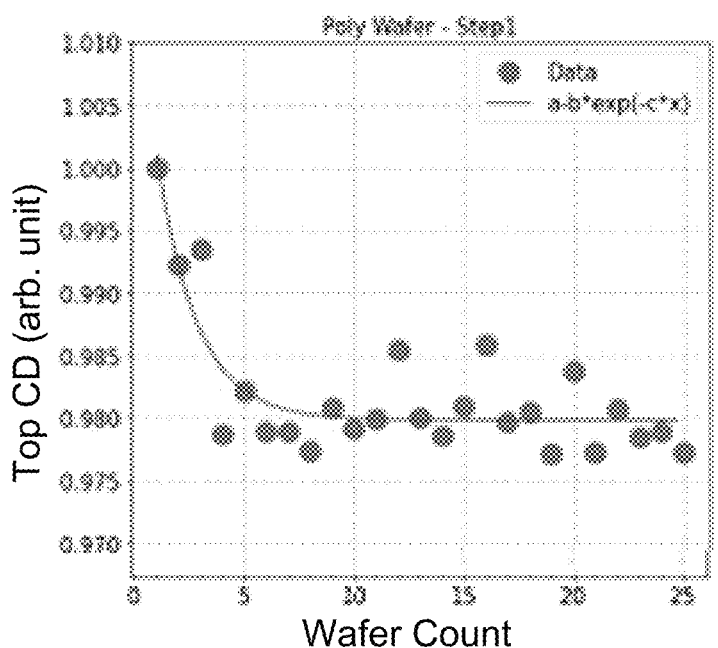
FIG. 3A shows a plot of a product parameter versus wafer counts, in accordance with one embodiment of the present disclosure.
Figure 3B:
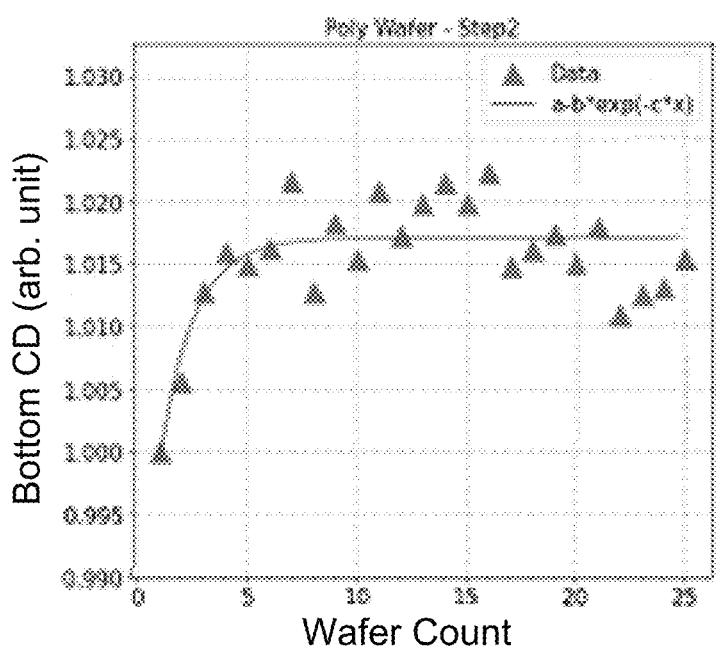
FIG. 3B shows another plot of another product parameter versus wafer counts, in accordance with another embodiment of the present disclosure.

FIGS. 3A and 3B show plots of product parameters versus wafer counts, in accordance with some example embodiments of the present disclosure. In FIG. 3A, Top CD means a top CD of a structure on a production wafer. Wafer Count means the number or order of a monitoring wafer. For example, Wafer Count of 5 means that the fifth monitoring wafer. Herein, the Top CD is an estimated value obtained by using a VM model, which can correspond to the VM model 133, and monitoring data associated with running a monitoring recipe on monitoring wafers. FIG. 3A shows a trend of the Top CD over time (or versus wafer counts). As can be seen, the Top CD eventually stabilizes (or saturates or levels off). Similarly, in FIG. 3B, Bottom CD means a bottom CD of a structure on a production wafer. The Bottom CD also eventually stabilizes (or saturates or levels off).

Figure 3C:
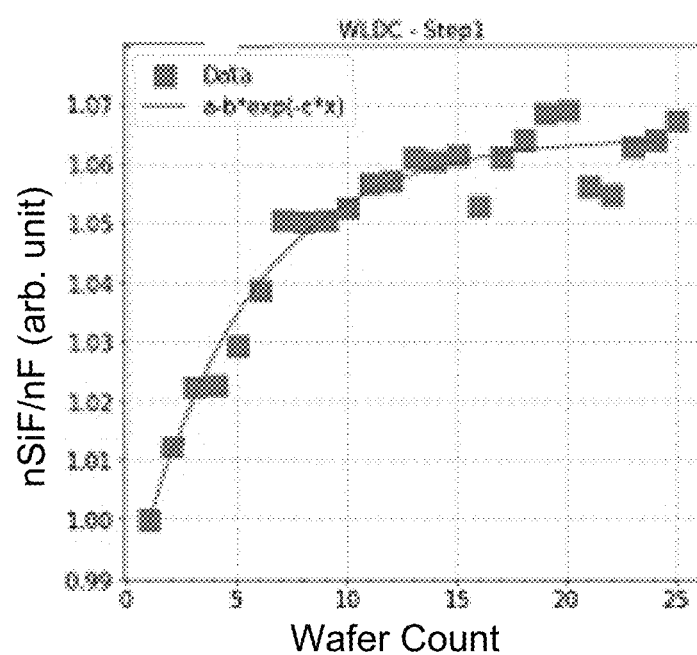
FIG. 3C (background art) shows yet another plot of yet another product parameter versus wafer counts, in related examples.

FIG. 3C (background art) shows another plot of another product parameter versus wafer counts, in related examples. Herein, seasoning is monitored indirectly by tracking byproduct signals, such as OES data of SiF and F. Particularly, nSiF/nF means a ratio of SiF concentration to F concentration or a ratio of SiF signal intensity to F signal intensity in OES. A distinct trend can be observed here: nSiF/nF does not stabilize over time, but keeps changing (e.g. increasing) instead.

Figure 4:
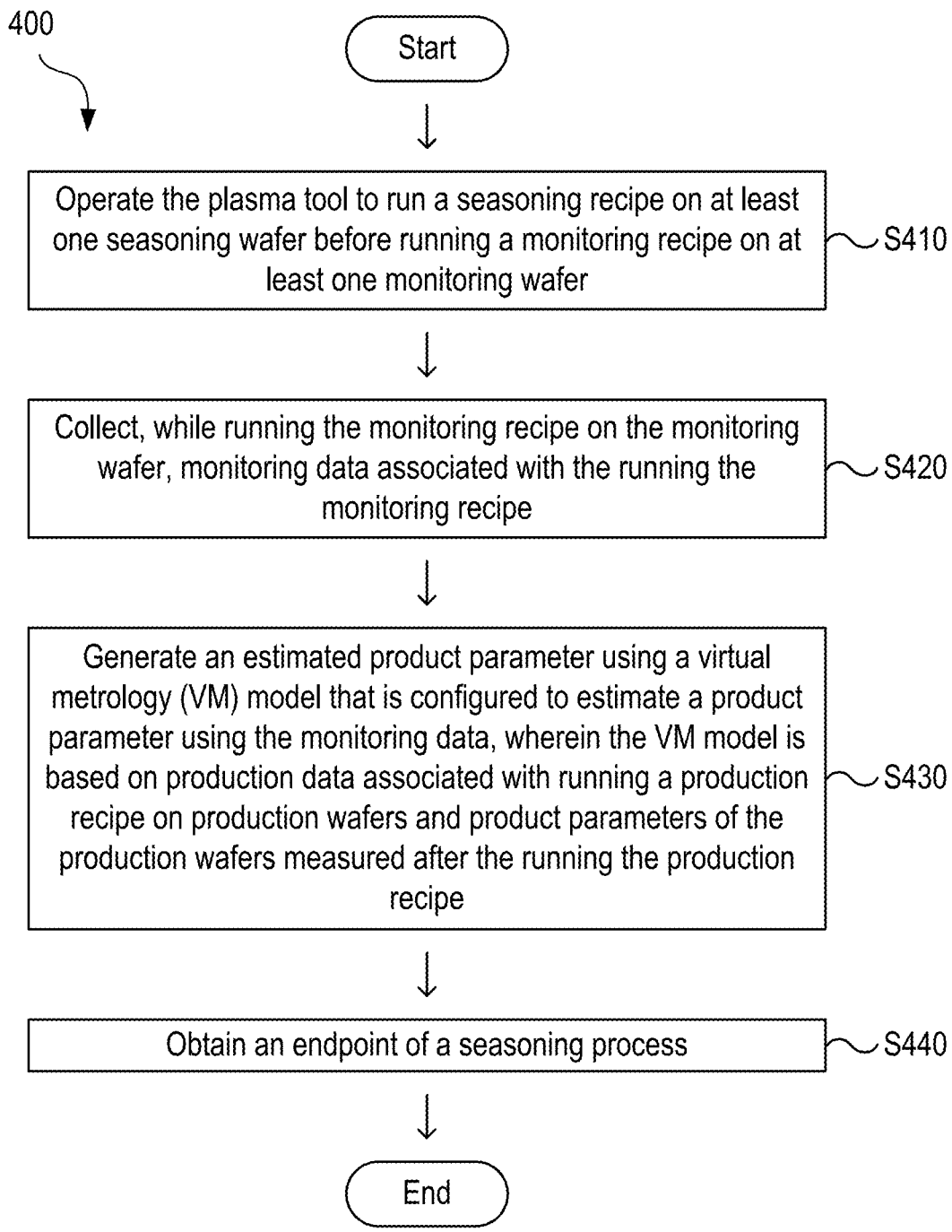
FIG. 4 shows a flow chart of a process for detecting an endpoint of seasoning of a plasma tool, in accordance with some example embodiments of the present disclosure.

FIG. 4 shows a flow chart of a process 400 for detecting an endpoint of a seasoning process (e.g. the seasoning process 100) of a plasma tool, in accordance with some example embodiments of the present disclosure. The process 400 begins with Step S410 by operating the plasma tool to run a seasoning recipe on at least one seasoning wafer (e.g. a blanket wafer) before running a monitoring recipe on at least one monitoring wafer. The process 400 then proceeds to Step S420 by collecting, while running the monitoring recipe on the monitoring wafer, monitoring data associated with the running the monitoring recipe. At Step S430, an estimated product parameter is generated using a virtual metrology (VM) model that is configured to estimate a product parameter using the monitoring data. The VM model is based on production data associated with running a production recipe on production wafers (e.g. patterned wafers) and product parameters of the production wafers measured after the running the production recipe. At Step S440, the endpoint of the seasoning process is obtained by repeating Step S410, Step S420 and Step S430. Particularly, the endpoint is obtained when the estimated product parameter stabilizes.

In some embodiments, the seasoning wafer and the monitoring wafer are blanket wafers including a same film composition. That is, the seasoning wafer and the monitoring wafer are a same type of wafers. Similarly, the seasoning recipe and the monitoring recipe can include a same recipe. That is, the seasoning recipe and the monitoring recipe can be the same as each other. Further, the same film composition and the same recipe can be configured such that running the seasoning recipe on the seasoning wafer and running the monitoring recipe on the monitoring wafer both generate at least one same byproduct as running the production recipe on the production wafers. As a result, seasoning runs and monitoring runs can both be used for the aforementioned dual purposes, i.e. seasoning and monitoring. Therefore, seasoning data associated with the seasoning runs can be collected while running the seasoning recipe on the seasoning wafer and added to the monitoring data (or used as additional monitoring data).

In some embodiments, the seasoning wafer is a blanket wafer including a first film composition while the monitoring wafer includes a second film composition that is different from the first film composition. That is, the seasoning wafer and the monitoring wafer are different types of wafers. Note that the monitoring wafer may or may not be a blanket wafer. Similarly, the monitoring recipe can be different from the seasoning recipe. Further, the second film composition and the monitoring recipe can be configured such that running the monitoring recipe on the monitoring wafer generates at least one same byproduct as running the production recipe on the production wafers.

It should be noted that additional steps can be provided before, during and/or after the process 400, and some of the steps described can be replaced, eliminated, or performed in a different order for additional embodiments of the process 400. In one example, after the process 400, the production recipe can be run on one or more production wafers after the endpoint is obtained. In another example, prior to the process 400, a preventative maintenance (PM) can be performed on the plasma tool. The PM may include at least one of replacing consumable parts, pulling and re-sealing vacuum connections or performing clean operations. Further, the VM model can be provided or built prior to the PM or built using historical data collected prior to the PM.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for detecting an endpoint of a seasoning process for a plasma tool, the method comprising:
   (a) operating the plasma tool to run a seasoning recipe on at least one seasoning wafer before running a monitoring recipe on at least one monitoring wafer;
   (b) collecting, while running the monitoring recipe on the monitoring wafer, monitoring data associated with the running the monitoring recipe;
   (c) generating an estimated product parameter using a virtual metrology (VM) model that is configured to estimate a product parameter using the monitoring data, wherein the VM model is based on production data associated with running a production recipe on production wafers and product parameters of the production wafers measured after the running the production recipe; and
   (d) obtaining the endpoint of the seasoning process by repeating (a), (b) and (c), wherein the endpoint is obtained when the estimated product parameter stabilizes.

2. The method of claim 1, wherein the seasoning wafer and the monitoring wafer are blanket wafers comprising a same film composition.

3. The method of claim 2, wherein the seasoning recipe and the monitoring recipe comprise a same recipe.

4. The method of claim 3, wherein (b) further comprises:
   collecting, while running the seasoning recipe on the seasoning wafer, seasoning data associated with the running the seasoning recipe; and
   adding the seasoning data to the monitoring data.

5. The method of claim 3, wherein the same film composition and the same recipe are configured such that running the seasoning recipe on the seasoning wafer and running the monitoring recipe on the monitoring wafer both generate at least one same byproduct as running the production recipe on the production wafers.

6. The method of claim 1, wherein:
   the seasoning wafer is a blanket wafer comprising a first film composition, and
   the monitoring wafer comprises a second film composition that is different from the first film composition.

7. The method of claim 6, wherein the monitoring recipe is different from the seasoning recipe.

8. The method of claim 6, wherein:
   the second film composition and the monitoring recipe are configured such that running the monitoring recipe on the monitoring wafer generates at least one same byproduct as running the production recipe on the production wafers.

9. The method of claim 6, wherein the monitoring wafer is a blanket wafer.

10. The method of claim 1, wherein:
    the seasoning wafer is a blanket wafer, and
    the production wafers are patterned wafers.

11. The method of claim 1, further comprising performing a preventative maintenance on the plasma tool, prior to the seasoning process.

12. The method of claim 11, wherein the preventative maintenance comprises at least one of replacing consumable parts, pulling and re-sealing vacuum connections or performing clean operations.

13. The method of claim 11, further comprising building the VM model prior to the preventative maintenance or building the VM model using historical data collected prior to the preventative maintenance.

14. The method of claim 11, prior to the preventative maintenance, the method further comprising:
    running the production recipe on the production wafers;
    collecting, while running the production recipe on the production wafers, the production data associated with the running the production recipe; and measuring, after running the production recipe on the production wafers, the product parameters of the production wafers.

15. The method of claim 1, wherein (b) is accomplished by using one or more sensors associated with the plasma tool.

16. The method of claim 15, wherein the one or more sensors are located outside a processing chamber of the plasma tool, inside the processing chamber, or both outside and inside the processing chamber.

17. The method of claim 15, wherein the one or more sensors comprise at least one of an optical emission spectrometry (OES) sensor, a reflectometer, a plasma sensor, a voltage and current (VI) sensor, a radio frequency (RF) sensor, a RF power meter, a pressure manometer or a gas flow meter.

18. The method of claim 1, wherein the monitoring data comprises at least one of OES data, reflectometry data, gas concentrations, VI data, RF data, pressure data, gas flow rate data or temperature data.

19. The method of claim 1, wherein the product parameter comprises at least one of a critical dimension (CD), an etch rate (ER), etch selectivity, an amount of remaining mask material, a film thickness, a film chemical composition, a film deposition rate, a film reflectivity, film absorbance, film resistivity or film conductivity.

20. An apparatus, comprising:
a controller including a processor that is programmed to detect an endpoint of a seasoning process for a plasma tool by:
(a) operating the plasma tool to run a seasoning recipe on at least one seasoning wafer before running a monitoring recipe on at least one monitoring wafer;
(b) collecting, while running the monitoring recipe on the monitoring wafer, monitoring data associated with the running the monitoring recipe;
(c) generating an estimated product parameter using a virtual metrology (VM) model that is configured to estimate a product parameter using the monitoring data, wherein the VM model is based on production data associated with running a production recipe on production wafers and product parameters of the production wafers measured after the running the production recipe; and
(d) obtaining the endpoint of the seasoning process by repeating (a), (b) and (c), wherein the endpoint is obtained when the estimated product parameter stabilizes.

* * * * *